United States Patent
Bui et al.

(12) 
(10) Patent No.: US 6,190,113 B1
(45) Date of Patent: *Feb. 20, 2001

(54) QUARTZ PIN LIFT FOR SINGLE WAFER CHEMICAL VAPOR DEPOSITION/ETCH PROCESS CHAMBER

(75) Inventors: Binh Bui, Sunnyvale; Roger N. Anderson, San Jose, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/846,250

(22) Filed: Apr. 30, 1997

(51) Int. Cl.$^7$ .................................................. C23C 16/00
(52) U.S. Cl. .................. 414/672; 118/729; 118/730; 118/719; 414/662; 414/217; 414/935; 432/239
(58) Field of Search .................................. 432/239, 253; 118/719, 725, 729, 500, 730; 414/935, 416, 592, 417, 940, 672, 662, 941, 939, 937, 800, 804, 805; 438/FOR 436

(56) References Cited

U.S. PATENT DOCUMENTS 4,591,044 * 5/1986 Ogami et al. .................... 414/935 X
5,044,943   9/1991 Bowman et al. .
5,421,893   6/1995 Perlov .
5,445,491 * 8/1995 Nakagawa et al. .............. 414/222 X

FOREIGN PATENT DOCUMENTS

274708 * 12/1989 (DE) ..................................... 414/935
123420 *  5/1989 (JP) ..................................... 414/935
124853 *  4/1992 (JP) ..................................... 414/941
190414 *  7/1993 (JP) ..................................... 414/417

* cited by examiner

Primary Examiner—Frank E. Werner
(74) Attorney, Agent, or Firm—Blakely Sokoloff Taylor & Zafman

(57) ABSTRACT

A wafer support device is provided. The wafer support device includes a susceptor having a surface configured to support a bottom surface of a wafer. The susceptor has a plurality of guiding recesses. The wafer support device also includes a pin lift that has a plurality of pins extending therefrom. The plurality of pins is configured to be passed via the plurality of guiding recesses of the susceptor to engage the bottom surface of the wafer. The susceptor is configured to be moved relative to the plurality of pins in a direction substantially orthogonal to the surface of the susceptor.

31 Claims, 6 Drawing Sheets

QUARTZ PIN LIFT FOR SINGLE WAFER CHEMICAL VAPOR DEPOSITION/ETCH PROCESS CHAMBER

BACKGROUND OF THE INVENTION (1) Field of the Invention

The present invention relates to devices utilized in semiconductor production processes. More specifically, the present invention relates to wafer support devices.

(2) Description of the Related Art

In the course of forming integrated circuit structures on semiconductor wafers, certain processes are utilized that involve the use of heated susceptors or wafer supports located in enclosed chambers where these processes take place. Some of these processes include, for example, growth of an epitaxial silicon layer, the formation of a thermal oxide or thermal nitride layer over silicon, the rapid thermal annealing of integrated circuit structures already formed on the wafer, etc. Typically, devices such as susceptors, susceptor supports, and wafer supports may be used for supporting the wafers horizontally from below.

FIG. 1 illustrates an assembly 100 for supporting a semiconductor wafer 104. Assembly 100 includes a susceptor 102 upon which semiconductor wafer 104 may be placed and supported horizontally. Susceptor 102 is typically supported by susceptor support 108 which includes a shaft 116 with three susceptor arms 109 that outwardly extend therefrom along directions positioned at 120° relative to one another. The susceptor support 108 further includes three legs 110. Each of legs 110 upwardly extends from a corresponding remote end of susceptor arm 109 to engage a bottom surface of susceptor 102 thereby supporting susceptor 102. Moreover, susceptor support 108 includes a central leg 117 that upwardly extends from shaft 116 to center susceptor 102.

Susceptor 102 includes three through-holes 113 formed therethrough at three locations that are positioned at 120° relative to one another on a circle that has a diameter smaller than a diameter of wafer 104. Three lift pins 112 that support wafer 104 are mounted through the three holes 113 of susceptor 102 of the assembly 100 for supporting wafer 104. FIG. 1 shows wafer 104 supported by lift pins 112 in a position where wafer 104 is displaced from susceptor 102 to allow a robot arm 103, placed between wafer 104 and susceptor 102, to insert or remove wafer 104 to/from assembly 100. A displacement between wafer 104 and susceptor 102 may be created by moving the susceptor support 108 downwards relative to wafer 104 while maintaining wafer 104 fixed at the same position.

The three holes 113 of susceptor 102 may have an upper portion that is tapered, with a gradual increasing diameter, positioned adjacent to an upper surface of the susceptor 102. A tapered section with gradually increasing diameter is also formed at an upper end of the lift pins 112. This tapered section is conformed to fit in the tapered section of the through-holes 113 so that lift pins 112 may be stopped at the susceptor level when the wafer 104 is placed directly upon the susceptor thereby preventing lift pins 112 from dropping passed the susceptor.

Lift pins 112 are typically installed from the top by dropping them through susceptor 102's through-holes 113 and through through-holes 115 of susceptor support arms 109. The installation of lift pins 112 is difficult as susceptor 102 is made of graphite, which is opaque, and which makes it practically impossible to see the through-holes 115 of susceptor arms 109 from above the susceptor, once pins 112 are inserted through through-holes 113.

Typically, susceptor 102 and wafer 104, that may be mounted thereon, are located in a sealed processing chamber (not shown) such as a double domed chamber (not shown), for example, where these devices may be heated by a plurality of heating devices (heat lamps) symmetrically arranged below the susceptor in the chamber, as well as over wafer 104. Heat from the heat lamps radiates through the dome to the underside of the susceptor to heat susceptor 102 as well as wafer 104 that may be positioned thereon. The wafer is also heated by a second set of heat lamps situated above an upper dome positioned over the wafer and the susceptor.

A use of central leg 117, that centers susceptor 102, in conjunction with the heating performed by the heat lamps may result in uneven distribution of heat across susceptor 102. This is caused by thermal coupling of the central portion of susceptor 102 to shaft 116 via central leg 117 as well as uneven distribution of heat radiating from the heat lamps to the susceptor 102 due to shadowing of the under side of susceptor 102 by central leg 117. Such uneven heating, or thermal non-uniformity, of susceptor 102 may further result in uneven heating of wafer 104.

The wafer support device shown in FIG. 1 further may include a wafer lift device that has three wafer lift arms 120 outwardly extending from wafer central lift 122. The wafer lift arms 120 may typically be integral with the wafer central lift 122. This design is disadvantageous as it requires replacement of the entire wafer lift device (the wafer lift arms 120 and the wafer central lift 122), when a wafer that has a different diameter is processed. Another disadvantage of this design, is that movement of susceptor support 108 in a downward direction is limited by wafer lift arms 120 thereby limiting the displacement that may be provided between wafer 104 and susceptor 102. Yet another disadvantage is that wafer lift arms 120 with pads 123 that support pins 112 create shadowing due to their position.

Furthermore, susceptor support 108 with arms 109 may be rotated by a rotation mechanism that may be installed at the lower part of shaft 116. When such rotation occurs wafer lift arms 120 and wafer central lift 122 are kept stationary. Such configuration requires that when shaft 116 is rotated a rotation mechanism is installed on the susceptor on the shaft at a position that ensures that when the rotation of the shaft 116 is terminated, the arms 109 guiding pins 112 are stopped at a position where these arms are aligned with wafer lift arms 120 such that a bottom part of pins 112 coincides with pads 123. Such exact installation of the rotation mechanism is limiting and undesirable.

It is desirable to provide a wafer support device with a susceptor support that permits more even heating and thermal uniformity or heat distribution across the susceptor and thereby more even heating or heat distribution across the semiconductor wafer being processed. It is also desirable to provide a wafer support device where the central wafer lift does not need to be changed with every wafer that has a different size. Also, it is desirable to provide a wafer support that does not interfere with the adjustment of the susceptor support.

BRIEF SUMMARY OF THE INVENTION

The present invention provides a wafer support device. The wafer support device includes a susceptor having a surface configured to support a wafer. The susceptor has a plurality of guiding recesses. The wafer support device also includes a wafer support that has a plurality of wafer support elements connected thereto. The plurality of wafer support elements is configured to be passed via the plurality of guiding recesses of the susceptor to engage the wafer. The susceptor is configured to be moved relative to the plurality of wafer support elements in a direction substantially orthogonal to the surface of the susceptor.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one of ordinary skill in the art will recognize that the invention may be practiced without these specific details. In some instances, well-known structures, and techniques have not been shown in detail to avoid obscuring the present invention.

Figure 2:
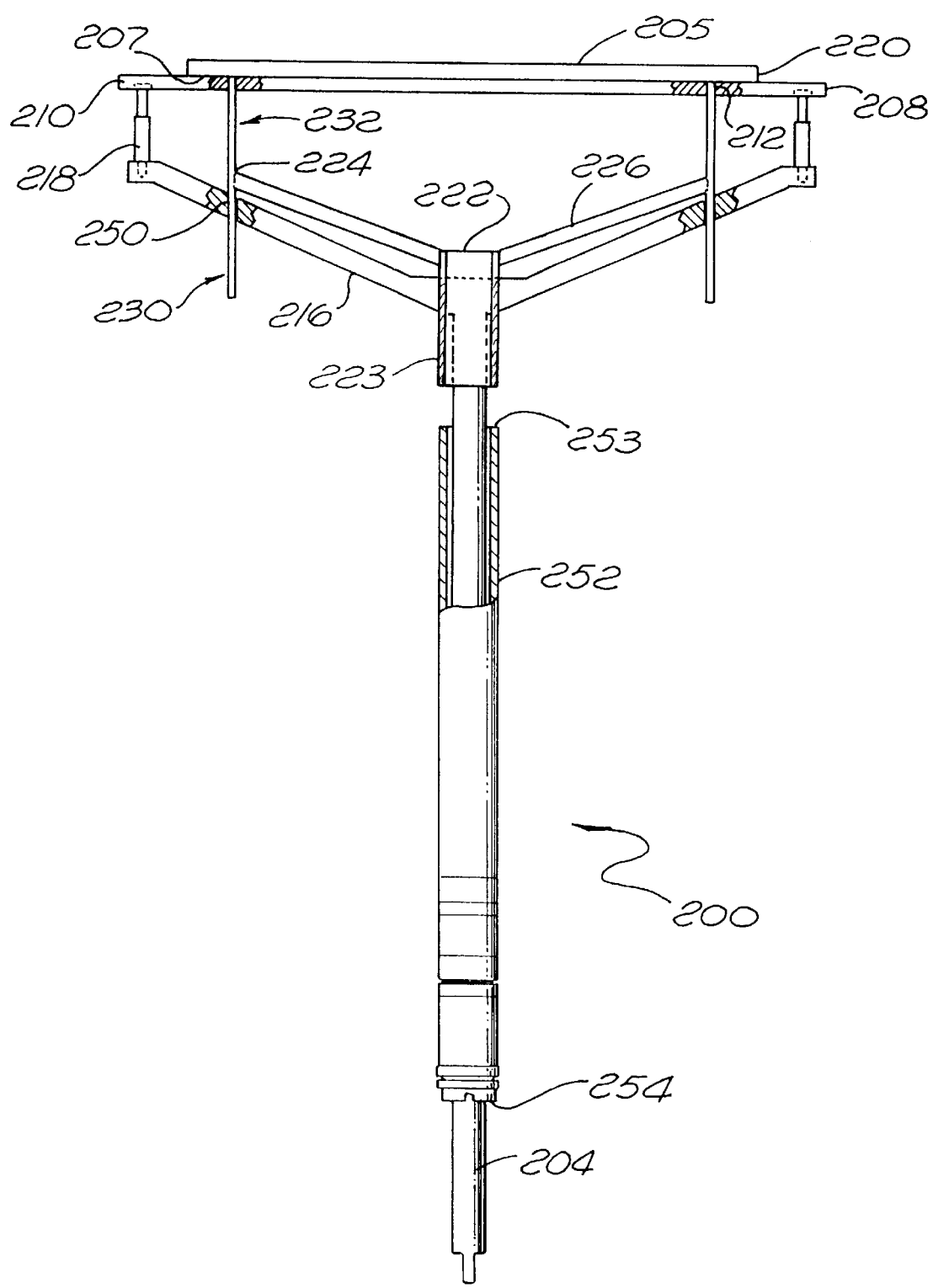
FIG. 2 illustrates a wafer support device according to the present invention.

FIG. 2 illustrates a wafer support device 200 according to the present invention. Typically, wafer support device 200 is configured to support wafer 205, horizontally from a bottom surface 207 of wafer 205, inside a process chamber (not shown) of a semiconductor production device. Wafer support device 200 includes susceptor 208 with top surface 210 configured to engage bottom surface 207 of wafer 205. Susceptor 208 is typically disk-shaped. Also susceptor 208 is made of graphite to provide good thermal conductivity. However, the present invention is not limited in scope to a disk-shaped susceptor made of graphite, as the susceptor may have other appropriate shapes to support wafer 205 and may be made of materials other than graphite, that provide good thermal conductivity. Susceptor 208 may be provided with a silicon carbide coating to enhance chemical stability thereof to corrosive materials which may be present in a process chamber (not shown) that encloses wafer support device 200 and wafer 205.

Susceptor 208 includes a plurality of guiding recesses 212 positioned on a circle that typically has a diameter smaller than a diameter of wafer 205. However, one skilled in the art may implement the present invention with guiding recesses 212 placed on the susceptor so as to be aligned with a periphery of wafer 205. In one embodiment according to the present invention described herein, guiding recesses 212 are through-holes. Susceptor 208 is supported by a susceptor support that includes a shaft 204 and a first plurality of susceptor support arms (hereinafter referred to as "susceptor support spokes") 216 outwardly extending from shaft 204.

In one embodiment according to the present invention the three susceptor support spokes 216 extend from shaft 204 at approximately 120° relative to one another. susceptor support spokes 216 may be welded to shaft 204 or mounted thereon in other ways that permit axial movement of spokes 216 together with shaft 204 when this shaft is axially moved up or down. In the embodiment of the present invention described in connection with FIG. 2, susceptor support spokes 216 extend slightly upwardly towards susceptor 208, but the present invention is not limited in scope to this configuration. Furthermore, the susceptor support includes, for each susceptor support spoke 216, a susceptor support leg 218 which extends upwardly from a free end of each of susceptor support spokes 216 to engage a bottom surface of susceptor 208 thereby supporting susceptor 208 at three points positioned 120° relative to one another on a circle having a diameter smaller than a diameter of susceptor 208.

It should be appreciated by one skilled in the art that the wafer support device according to the present invention is not limited to the three susceptor support legs 218 supporting susceptor 208, but the number of such susceptor support legs may vary according to specific implementations. Also, instead of having a discrete number of susceptor support legs, one may design the wafer support device according to the present invention to utilize a continuous (360°) susceptor support "leg" such as a cylindrical collar.

Typically the susceptor support may be moved upwardly and downwardly as shaft 204 may be coupled at a lower part thereof to a motor that may cause upward and downward movement of the shaft and therefore of the susceptor support. The upward or downward movement of the susceptor support may cause a displacement of susceptor 208, relative to wafer 205, that is supported by way of a wafer support 222 (hereinafter referred to as a "pin lift device 222"). Pin lift device 222 is typically made of quartz, but one skilled in the art may use other material with properties closely related to quartz. Pin lift device 222 includes a central portion, hub 223, mounted onto susceptor support spokes 216 adjacent an upper part of shaft 204 from where susceptor support arms 216 outwardly extend. Pin lift device 222 further includes a plurality of pin lift arms 226 (hereinafter referred to as "pin lift spokes 226") that are connected to an upper part of hub 223. Moreover, pin lift device 222 includes a plurality of wafer support elements 224 (hereinafter referred to as "lift pins") that are attached to a free end (remote, from the hub 223) of pin lift spokes 226. In one embodiment according to the present invention described herein pin lift device 222 includes three pin lift spokes 226 and three lift pins 224 corresponding to pin lift spokes 226. However, the present invention is not limited in scope in this respect to three pin lift spokes 226 and three lift pins 224.

Pin lift spokes 226 are positioned 120° relative to one another and extend outwardly and slightly upwardly towards a periphery 220 of the wafer. Pin lift spokes 226 are attached to hub 223 such that hub 223 and pin lift spokes 226 may move together axially upwardly or downwardly, or rotationally. Pin lift spokes 226 may be integral with hub 223, but the present invention is not limited in scope in this respect. Also, lift pins 224 may be integral with pin lift spokes 226, to move upward or downward together with hub 223 when hub 223 is axially moved up or down or when hub 223 is rotated. In one embodiment according to the present invention described herein, lift pins 224 vertically extend on both sides of pin lift spokes 226, each pin 224 having a lower part 230 extending beneath pin lift spokes 226 and an upper part 232 extending, above pin lift spokes 226, towards guiding recesses 212

Pin lift device 222 is configured such that lift pins 224 are aligned with the guiding recesses 212 of susceptor 208 to permit a portion of the upper part 232 of lift pins 224 to pass through guiding recesses 212 when susceptor 208 is moved upwardly or downwardly relative to pin lift device 222. Pin lift device 222 supports lift pins 224 such that guiding recesses 212 of susceptor 208 do not need to have a tapered upper portion but these recesses may just include a clearance hole reducing the cost of fabricating susceptor 208. The lower part 230 of each lift pin 224 is configured to pass through a corresponding through-hole 250 made through the plurality of susceptor support spokes 216. Accordingly, pins 224 may move upwardly and downwardly relative to susceptor support arms 216 and to susceptor 208. The up and down movement, relative to susceptor 208, of the pin lift device 222 and therefore of pins 224 may be caused by a vertical movement of the susceptor support while pin lift device 222 is maintained stationary. Note that susceptor support spokes 216 with hub 223, susceptor support spokes 216, and pins 224 may rotate together when such rotation is induced by a rotating device (not shown) that may be mounted at a lower part of shaft 204 to impart a rotational movement to susceptor support.

Figure 1:
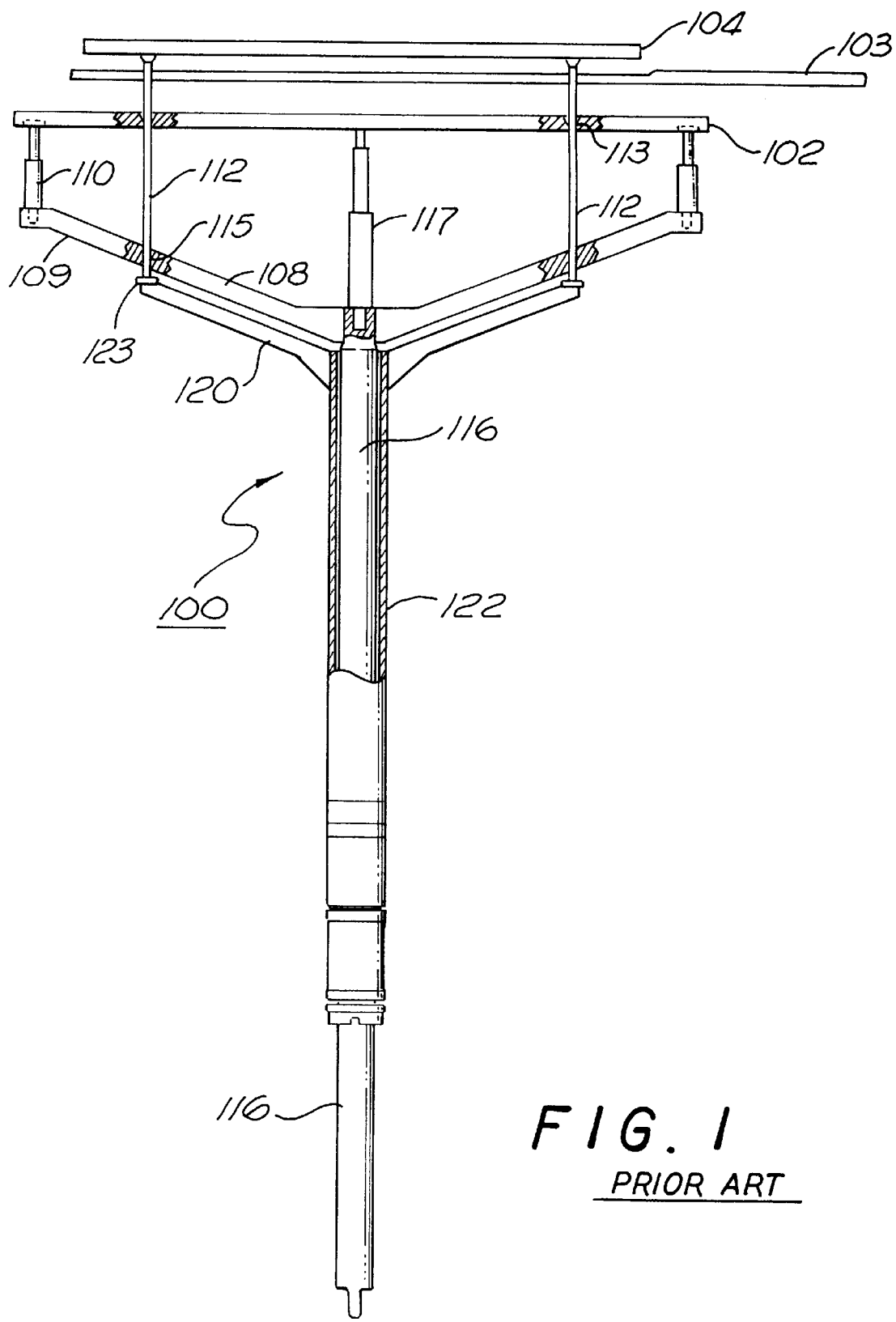
FIG. 1 illustrates an assembly for supporting a semiconductor wafer.

The wafer support device according to the present invention with pin lift device 222 has pin lift spokes 226 substantially (superimposed) aligned with susceptor support spokes 216 of the susceptor support. These pin lift spokes are moved together, in alignment with susceptor support spokes 216 when a rotation device is installed and rotates the shaft 204. By having pin lift spokes 226 positioned above and in alignment with susceptor support spokes 216, the shadowing problem explained in connection with the embodiment described in FIG. 1 is substantially reduced. Additionally, by having pin lift spokes 226 configured to rotate together and in alignment with susceptor support spokes 216, the rotation device may be installed at any position onto the shaft 204 and does not have to be limited in installation to only three positions as the assembly described in connection with FIG. 1. For information related to a rotating device or a rotating mechanism that may possibly be used in connection with the present invention, please see U.S. Pat. No. 5,421,893, assigned to Applied Materials, Inc.

Figure 3:
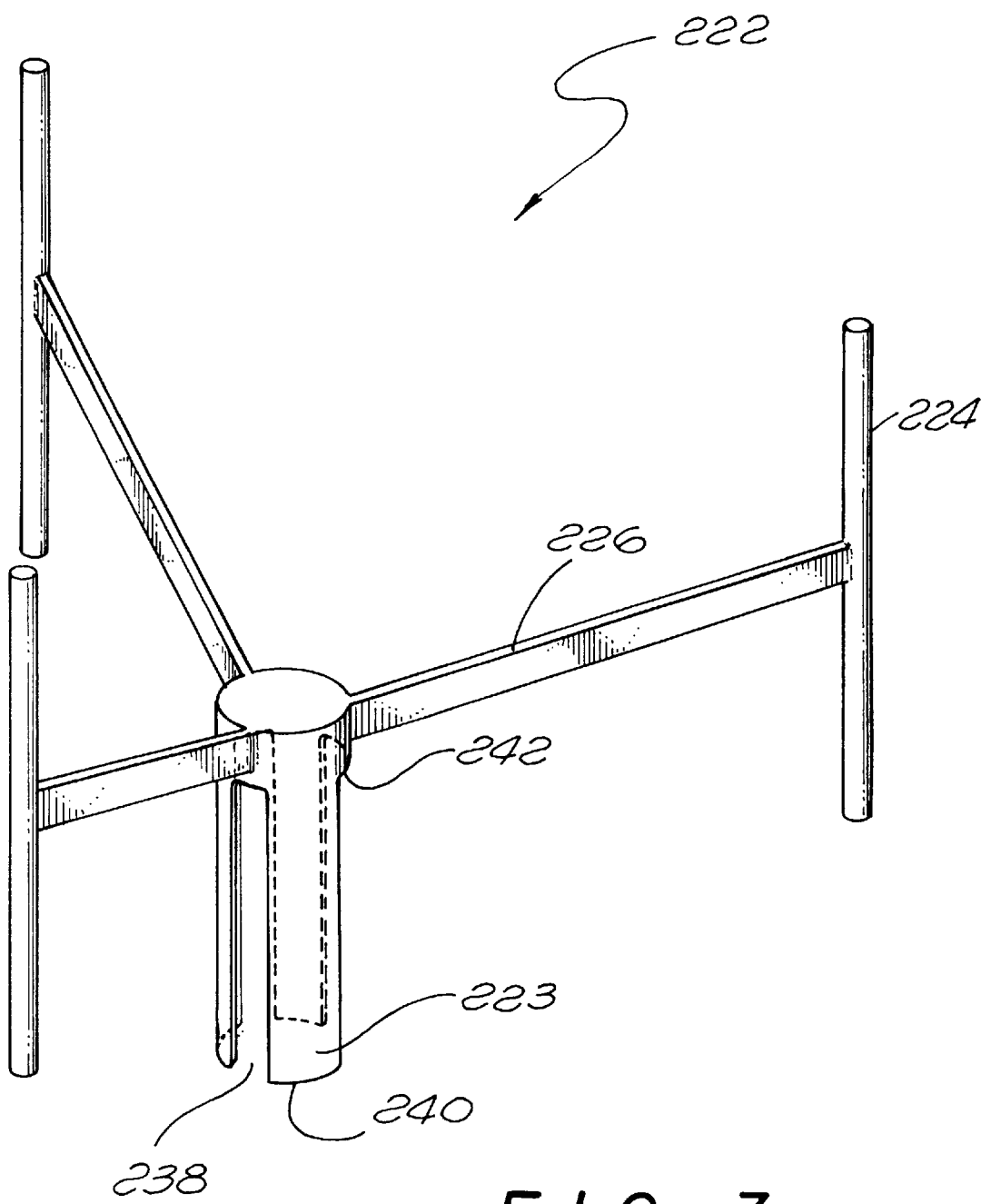
FIG. 3 illustrates a wafer support utilized in connection with the wafer support device according to the present invention.

FIG. 3 illustrates, in a simplified manner, a pin lift device 222 including central hub 223, pin lift spokes 226 outwardly extending therefrom, and lift pins 224 vertically extending from pin lift spokes 226. Central hub 223 has a generally cylindrical hollow shape and includes slits 238 longitudinally extending along hub 223. Slits 238 extend from a base 240 of hub 223 to upper ridges 242. Slits 238 are configured to pass therethrough susceptor support spokes 216 (shown in FIG. 2). Upper ridges 242 are configured to prevent susceptor support spokes 216 from moving further up relative to hub 223 once susceptor support spokes 216 come into engagement with upper ridges 242. Note that pin lift spokes 226 are superimposed with slits 238 such that upon mounting of susceptor support spokes 216 through slits 238 pin lift spokes 226 and susceptor support spokes 216 are aligned. Such alignment causes a reduction in the shadowing otherwise caused have pin lift spokes 226 not been aligned with suceptor support spokes 216.

Going back to FIG. 2, one way of causing a displacement between wafer 205 and susceptor 208 is by producing a relative movement of susceptor support spokes 216 through slits 238 of hub 223 (FIG. 3) while pin lift device 222 is maintained fixed. This relative movement may occur when base 240 of hub 223 (FIG. 3) comes into engagement with a rim 253 of a wafer central lift device 252. The wafer central lift device 252 has a generally cylindrical shape with a hollow interior configured to accommodate shaft 204. The wafer central lift device 252 may be mounted at a lower part thereof 254 to a motor (not shown) that may cause an "up" or "down" movement of wafer central lift device 252. Once the base 240 of hub 223 (FIG. 3) engages upper rim 253 of wafer central lift device 252 and the wafer central lift device 252 is maintained stationary, shaft 204 may move downwards "pulling" along downwardly susceptor support spokes 216 via slits 238 of hub 223 (FIG. 3) and causing susceptor 208 to move downwardly. By keeping the wafer central lift device 252 stationary and, accordingly, pin lift device 222 stationary, the downward movement of the susceptor support causes a displacement between wafer 205, that remains stationary, as being supported by pins 224, and susceptor 208 that is moved downwardly by virtue of the movement of the susceptor support. The configuration of the present invention with pin lift device 222 permits increased displacement of the susceptor support relative to the displacement of the susceptor support permitted by conventional wafer support devices.

When the susceptor support is moved upwardly, the displacement between the wafer 205 and susceptor 208 decreases. When susceptor support spokes 216 reach upper ridge 242 of hub 223, any upward movement of the susceptor support spokes 216 causes pin lift device 222 and thus wafer 205 to move along with susceptor 208 such that the distance between the wafer 205 and the susceptor 208 remains unchanged.

Figure 4:
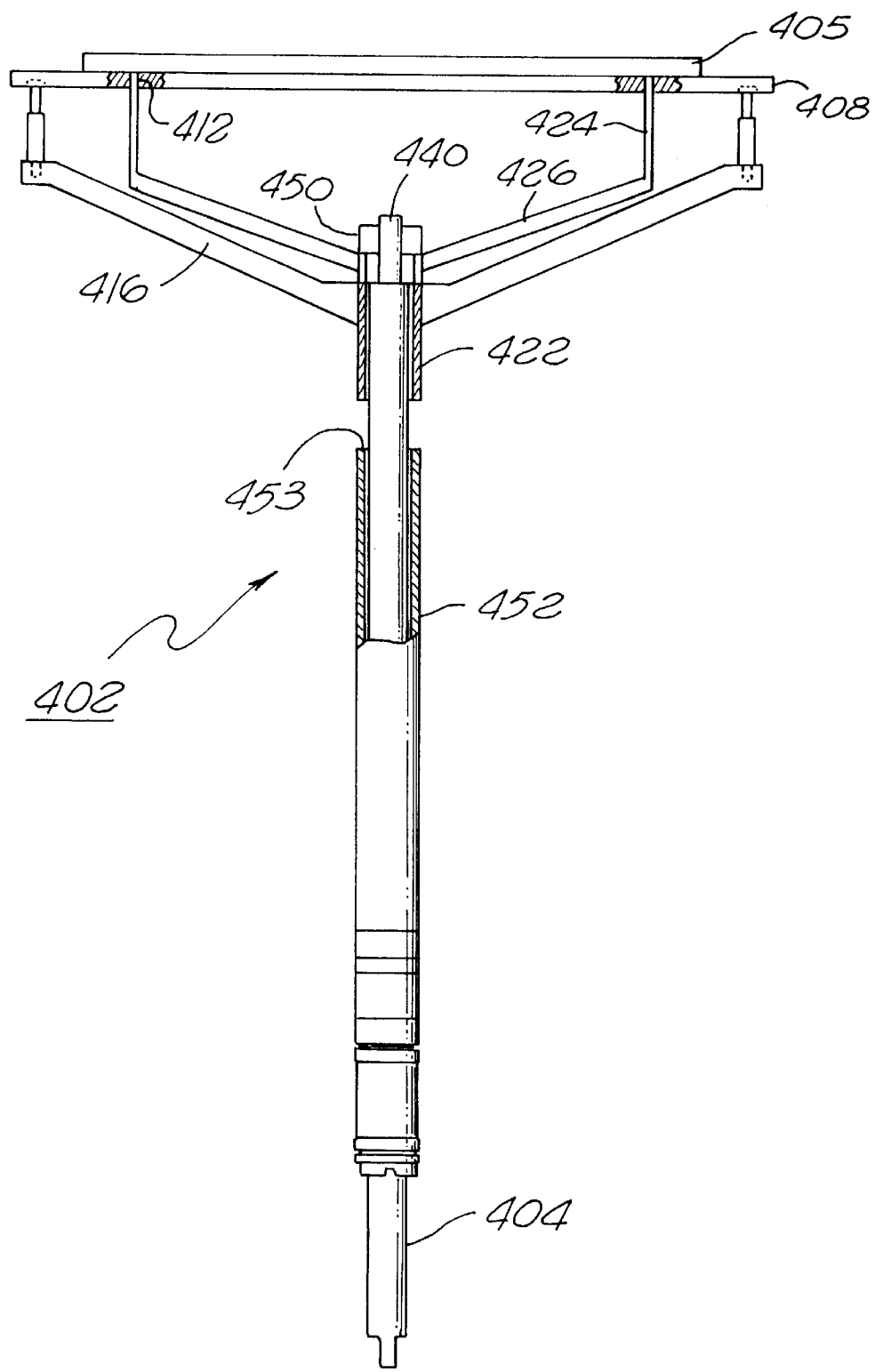
FIG. 4 illustrates a second embodiment of a wafer support device according to the present invention.

FIG. 4 illustrates a second embodiment of a wafer support device 402 according to the present invention. In this embodiment, pin lift device 422 includes lift pins 424 that upwardly extend from spokes 426 of the pin lift device 422 from one side (the upper side) of these spokes 426. According to this embodiment, there is no need to use guiding recesses through susceptor support spokes 416 to permit upward and downward movement of lift pins 424 but rather holes 412, provided in susceptor 408, suffice to guide lift pins 424 upwardly and downwardly. The pin lift device 422 is thus less fragile and its mounting onto the wafer support device 402 is greatly facilitated by only having to lift pass pins 424 through holes 412.

Optionally, the susceptor support may include a center post 440 positioned at an upper end thereof. Center post 440 is built as a step, with a diameter thereof smaller than a diameter of shaft 404, to provide additional guidance to the pin lift device 422. The pin lift device 422 shown in FIG. 4 includes an annular element 450 that has a hollow interior with a diameter substantially equal to the diameter of center post 440. Also center post 440 provides susceptor support additional weight that helps the susceptor support to move down, by virtue of gravity, towards upper rim 453 of wafer lift device 452.

Figure 5:
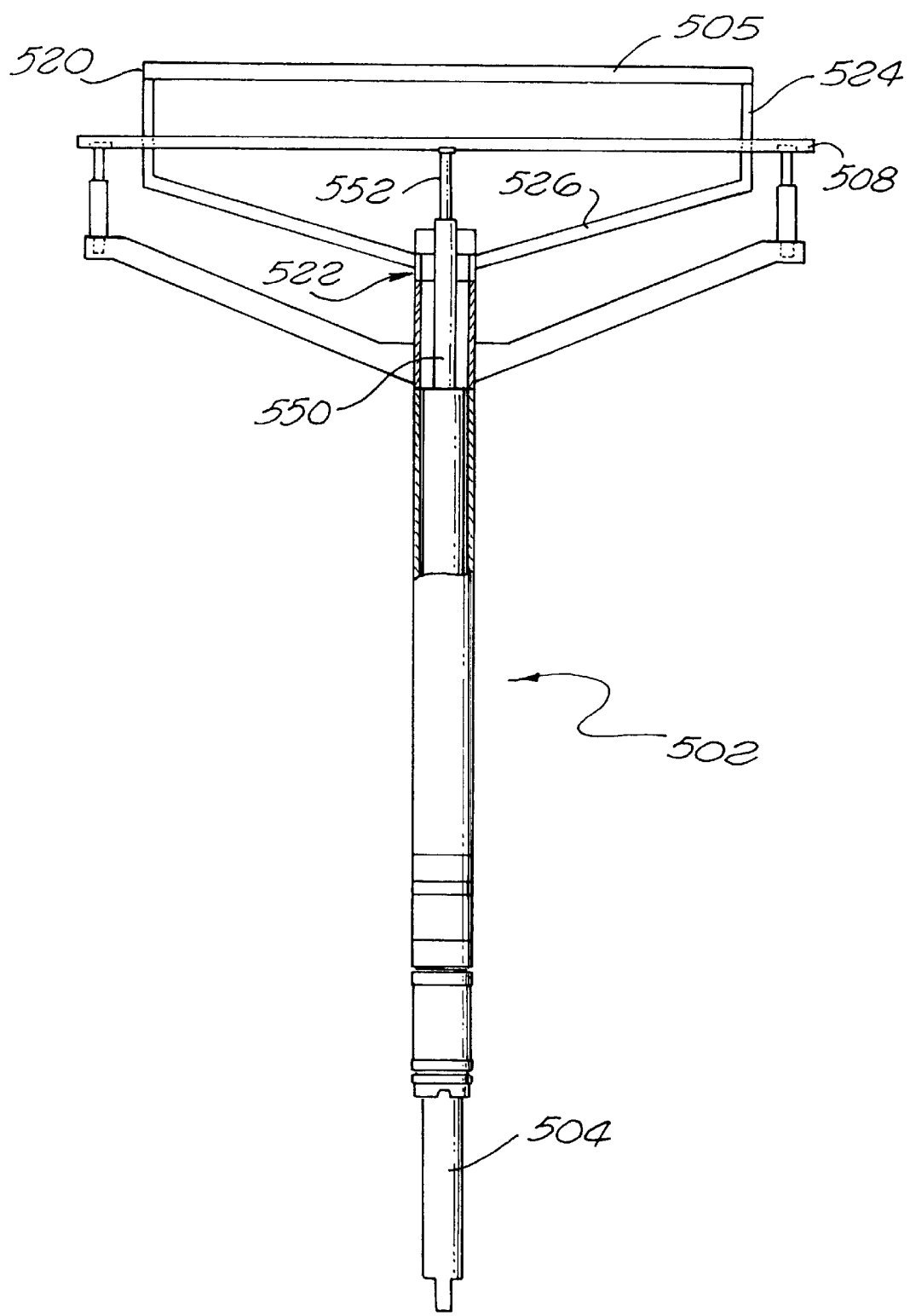
FIG. 5 illustrates a third embodiment of the wafer support device according to the present invention.

FIG. 5 illustrates a third embodiment of a wafer support device 502 according to the present invention. In this embodiment pin lift device 522 is designed so that lift pins 524, that extend upwardly from a free end of spokes 526, engage wafer 505 at a periphery 520 thereof. By lifting wafer 505 from the periphery thereof, this embodiment helps reduce the cool/hot spots on the body of the wafer that otherwise may be produced by pins 224 of FIG. 1. Additionally, as an option, wafer support device 502 may have shaft 504 provided at an upper part thereof with stepped posts 550 and 552. Post 550 has a diameter smaller than a diameter of shaft 504. Moreover, post 552 has a diameter smaller than the diameter of post 550. Post 552 is provided for centering susceptor support 508. Note that the relatively small diameter of post 552 minimizes the shadow created at the center of susceptor support 508.

Figure 6:
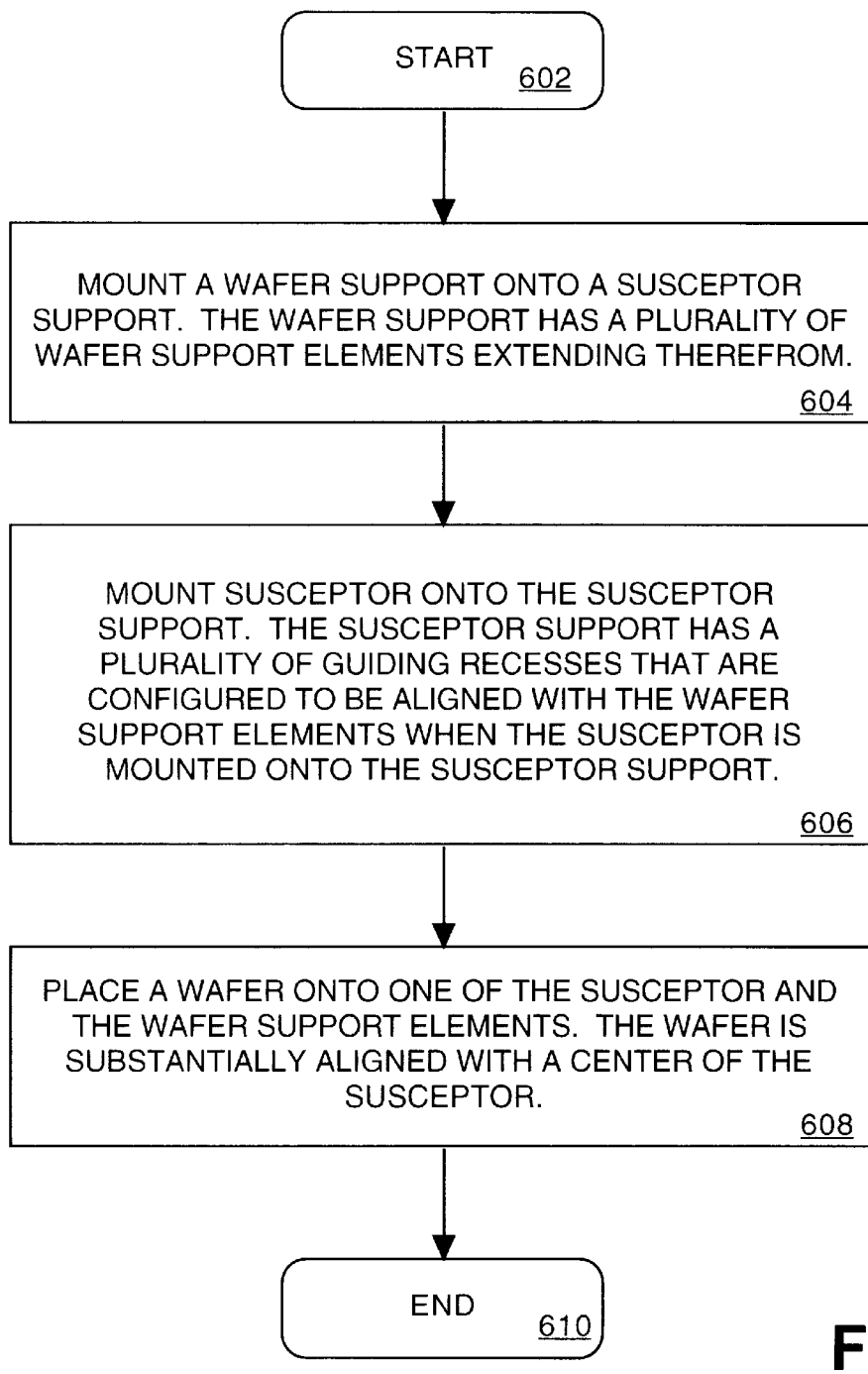
FIG. 6 illustrates a method according to the present invention for providing support to a wafer.

FIG. 6 illustrates a flow chart for process of providing support to a wafer in an apparatus for processing semiconductor wafers. The process starts at 602 from where it passes to block 604. At block 604 a wafer support is mounted onto a susceptor support. The wafer support has a plurality wafer support elements extending therefrom. The wafer support may be a wafer support as the wafer support illustrated in connection with FIGS. 2–5. The wafer support elements that extend from the wafer support may be the lift pins shown in FIGS. 2–5. The process then passes to block 606 where a susceptor is mounted onto the susceptor support. The susceptor has a plurality of guiding recesses that are configured to be elements when the susceptor is mounted onto the susceptor support. The susceptor may be mounted onto the susceptor support such that the susceptor support holds the susceptor at a number of discrete points as shown in the embodiments described in connection with FIGS. 2–5. The process then passes to block 608 where a wafer is placed onto the susceptor if the wafer support elements (pins) do not protrude through the guiding recesses onto the susceptor. The wafer may alternatively be mounted onto the wafer support elements such that the wafer is aligned with the wafer support.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A wafer supports device comprising:
   a susceptor having a bottom surface and a top surface configured to support a wafer to be processed, said susceptor having a plurality of through holes extending between the bottom surface and the top surface;
   a pin lift device having a central portion with a first plurality of arm extending therefrom and a plurality of lift pins each having an end, each of said plurality of lift pins coupled to and extending from respective ones of said first plurality of arms, said ends of said plurality of lift pins configured to be passed through said plurality of through holes of said susceptor;
   a susceptor support having a second plurality of arms to support said susceptor at said bottom surface of the susceptor; and
   a motive device to move the susceptor support in a vertical direction from a first position wherein said ends of said plurality to lift pins are at most flush with the top surface of the susceptor to a second position wherein said plurality of lift pins project above said top surface of said susceptor,
   wherein said central portion is configured to be supported by said second plurality of arms by abutment of said second plurality of arms with said central portion.

2. The wafer support device of claim 1 wherein each of said plurality of lift pins of said wafer support extends from the free end of a corresponding arm of said first plurality of arms towards a corresponding through hole of said susceptor.

3. The wafer support of claim 1 wherein said plurality of lift pins are aligned with said plurality of through holes of said susceptor.

4. The wafer support device of claim 1 further including a wafer lift device engageble at a first end thereof by said motive device and configured to engage at a second end thereof said central portion of said pin lift device and to move said pin lift device in a direction substantially orthogonal relative to said top surface of said susceptor, when said wafer lift device is moved in said direction.

5. The wafer support device of claim 1 further including a susceptor support configured to support said susceptor and to be moved in a direction substantially orthogonal to said top surface of said susceptor.

6. The wafer support device of claim 5 wherein said susceptor support includes a shaft, and a second plurality of arms extending from said shaft.

7. The wafer support device of claim 6 wherein said pin lift device is configured with said first plurality of arms to be aligned with second plurality of arms.

8. The wafer support device of claim 6 wherein said second plurality of arms includes a plurality of through-holes configured to be aligned with said through holes of said susceptor when said susceptor is supported by said susceptor support.

9. The wafer support device according to claim 6 wherein said central portion includes a hub having a plurality of slits for permitting said second plurality of arms to be guided therethrough.

10. The wafer support device of claim 9 wherein said hub includes a plurality of ridges terminating said slits, said plurality of ridges configured to stop said second plurality of arms from moving upwardly relative to said hub, when said second plurality of arms engage said plurality of ridges.

11. The wafer support device of claim 9 wherein said plurality of slits are aligned with said first plurality of arms.

12. The wafer support device of claim 1 wherein said lift pins are configured to engage said wafer at a periphery thereof.

13. The wafer support device of claim 5 further including a device for imparting rotary movement to said susceptor support.

14. The wafer support device of claim 13 wherein said pin lift device is configured to be rotated with said susceptor support when rotary movement is imparted to said susceptor support.

15. The wafer support device of claim 1 wherein said lift pins are configured to be moved together with said pin lift device when said pin lift device is moved.

16. An apparatus comprising:
   a chamber including,
   a susceptor disposed within a volume of said chamber having a bottom surface and a top surface configured to support a wafer to be processed, said susceptor having a plurality of through holes extending between the bottom surface and the top surface;
   a pin lift device having central portion with a first plurality of arms extending therefrom and a plurality of lift pins each having an end, each of said plurality of lift pins coupled to and extending from said first plurality of arms, said ends of said plurality of lift pins configured to be passed through said plurality of through holes of said susceptor;
   a susceptor support having a second plurality of arms to support said susceptor at said bottom surface of the susceptor; and
   a motive device to move the susceptor support in a vertical direction from a first position wherein said ends of said plurality of lift pins are at most flush with the top surface of the susceptor to a second position wherein said plurality of lift pins project above said top surface of said susceptor, wherein said central portion is configured to be supported by said second plurality of arms by abutment of said second plurality of arms with said central portion.

17. The apparatus of claim 16 wherein said pin lift device includes a first plurality of arms outwardly extending from said central portion, said first plurality of arms having a free end.

18. The apparatus of claim 17 wherein each of said plurality of lift pins of said wafer support extends from the free end of a corresponding arm of said first plurality of arms towards a corresponding through hole of said susceptor.

19. The apparatus of claim 16 wherein said plurality of lift pins are aligned with said plurality of through holes of said susceptor.

20. The apparatus of claim 16 further including a wafer lift device engageable at a first end thereof by said motive device and configured to engage at a second end thereof said central portion of said pin lift device and to move said pin lift device in a direction substantially orthogonal relative to said top surface to said susceptor, when said wafer lift device is moved in said direction.

21. The apparatus of claim 16 further including a susceptor support configured to support said susceptor and to be moved in a direction substantially orthogonal to said top surface of said susceptor.

22. The apparatus of claim 21 wherein said susceptor support includes a shaft, and a second plurality of arms extending from said shaft.

23. The apparatus of claim 22 wherein said second plurality of arms includes a plurality of through-holes configured to be aligned with said through holes of said susceptor when said susceptor is supported by said susceptor support.

24. The apparatus of claim 22 wherein said central portion includes a hub having a plurality of slits for permitting said second plurality of arms to be guided therethrough.

25. The apparatus of claim 24 wherein said hub includes a plurality of ridges terminating said slits, said plurality of ridges configured to stop said second plurality of arms from moving relative to said hub, when said second plurality of arms engage said plurality of ridges.

26. The apparatus of claim 16 wherein said plurality of lift pins is configured to engage said wafer at a periphery thereof.

27. The apparatus of claim 21 further including a device for imparting rotary movement to said susceptor support.

28. The apparatus of claim 27 wherein said wafer support configured to be rotated with said susceptor support when rotary movement is imparted to said susceptor support.

29. The apparatus of claim 16 further including a wafer lift device engageable at a first end thereof by said motive device and configured to engage at a second end thereof said central portion of said pin lift device and to move said pin lift device in a direction substantially orthogonal relative to said top surface of said susceptor, when said wafer lift device is moved in said direction.

30. A wafer support device comprising:

a susceptor having a bottom surface and a top surface configured to support a wafer to be processed, said susceptor having a plurality of through holes extending between the bottom surface and the top surface;

a pin lift device having a central portion with a first plurality of arms extending therefrom and a plurality of lift pins extending from said first plurality of arms, said plurality of lift pins configured to be passed via said plurality of through holes of said susceptor to engage said wafer, said central portion including a hub having a plurality of slits;

a susceptor support having a second plurality of arms to support said susceptor at said bottom surface thereof, said central portion of said pin lift device engaged by alignment of said second plurality of arms with said plurality of slits in said hub;

a motive device to move the susceptor support in a vertical direction from a first position wherein said ends of said plurality of lift pins are at most flush with the top surface of the susceptor to a second position wherein said plurality of lift pins project above said top surface of said susceptor; and a wafer lift engageable at a first end thereof by said motive device and configured to engage at a second end thereof said pin lift device and to move said susceptor support in a direction substantially orthogonal to said surface of said susceptor.

31. A wafer support device comprising:

a susceptor having a bottom surface and a top surface configured to support a wafer to be processed, said susceptor having a plurality of through holes; and a pin lift device having a hub with a first plurality of arms extending therefrom and a plurality of lift pins extending from said first plurality of arms, said plurality of lift pins configured to be passed through said plurality of through holes of said susceptor to engage said wafer;

a susceptor support having a second plurality of arms to support said susceptor at said bottom surface of said susceptor;

a motive device to move the susceptor in a vertical direction from a first position wherein said ends of said plurality of lift pins are at most flush with the top surface of the susceptor to a second position wherein said plurality of lift pins project above said top surface of said susceptor; and wherein said hub further includes a plurality of slits, to guide therethrough said second plurality of arms, and a plurality of ridges terminating said plurality of slits, said second plurality of arms supporting said pin lift device when engaging said plurality of ridges.

* * * * *